United States Patent [19]
Saito

[11] Patent Number: 5,949,270
[45] Date of Patent: Sep. 7, 1999

[54] CIRCUIT AND METHOD OF COMPENSATING FOR THRESHOLD VALUE OF TRANSISTOR USED IN SEMICONDUCTOR CIRCUIT

[75] Inventor: Miyoshi Saito, Kawasaki, Japan

[73] Assignee: Fujitsu Limited, Kanagawa, Japan

[21] Appl. No.: 08/820,903

[22] Filed: Mar. 19, 1997

[30] Foreign Application Priority Data

Jun. 14, 1996 [JP] Japan .................................. 8-154572

[51] Int. Cl.[6] .................................................. H03K 17/16
[52] U.S. Cl. .......................... 327/390; 327/391; 327/434; 327/362; 327/378; 326/31; 326/34
[58] Field of Search ..................................... 327/378, 382, 327/390, 391, 434, 362, 374, 379; 326/31, 33, 34

[56] References Cited

U.S. PATENT DOCUMENTS

| | | | |
|---|---|---|---|
| 4,527,074 | 7/1985 | Donalson et al. | 307/246 |
| 4,593,206 | 6/1986 | Neidoff et al. | 307/270 |
| 4,689,495 | 8/1987 | Liu | 307/264 |
| 4,864,159 | 9/1989 | Cornelissen | 307/264 |
| 5,118,971 | 6/1992 | Schenck | 307/443 |
| 5,481,207 | 1/1996 | Crafts | 326/86 |

*Primary Examiner*—Timothy P. Callahan
*Assistant Examiner*—Jung Ho Kim
*Attorney, Agent, or Firm*—Nikaido Marmelstein Murray & Oram, LLP

[57] ABSTRACT

A capacitor is connected between the gate of a transistor that is an object of threshold voltage compensation and an input terminal. A switching device is connected between a current source connected to one terminal of the transistor and the gate of the transistor. A second switching device is connected between the input terminal and a terminal to which a reference voltage is applied. The switching device is turned ON so that the transistor is diode-connected. The switching device is turned ON, thus applying the reference voltage to the input terminal. A reference voltage is applied to a current inflow terminal connected to another terminal of the transistor. After charge dependent on the threshold voltage of the transistor is accumulated in the capacitor, the switching device is turned OFF. With this control, a difference of a threshold voltage from another deriving from the fine structure of transistors as well as a difference in threshold voltage between adjoining transistors can be compensated for.

12 Claims, 16 Drawing Sheets

CIRCUIT AND METHOD OF COMPENSATING FOR THRESHOLD VALUE OF TRANSISTOR USED IN SEMICONDUCTOR CIRCUIT

BACKGROUND OF THE INVENTION

1. Field of the Invention

The present invention relates to an art for compensating for a threshold voltage of a transistor employed in a semiconductor circuit. More particularly, this invention is concerned with a circuit effective in compensating for a difference of a threshold voltage from another and the configuration of a sense amplifier using the circuit.

In recent years, a short channel effect, narrow channel effect, or the like has come to light with the advent of a finely-structured semiconductor device. The short channel effect is a phenomenon that a shorter gate results in a lower threshold voltage, while the narrow channel effect is a phenomenon that a narrower gate results in a higher threshold voltage. If the length or width of a gate differs from one another due to a difference of a transistor from another occurring in the course of manufacturing, the threshold voltage of the transistor becomes different from another. Moreover, reportedly, an avoidable difference of a threshold voltage from another results from the natural distribution of ions occurring during ion implantation performed for forming channels. If the structure of a semiconductor device becomes finer in the future, it would be hard to suppress such a difference. An art of circuit design that takes account of the difference is demanded.

2. Description of the Related Art

In the past, a method of compensating for a threshold voltage has been devised as one of design arts taking account of a difference of a threshold voltage from another. A so-called well drive approach is well-known as one of the methods. The well drive approach is an approach in which a threshold voltage is practically changed by changing the potential at a well in a semiconductor substrate. This approach is effective when, for example, the threshold voltage of a chip is the same over the whole chip or over a relatively wide area in the chip, but there is a difference in threshold voltage between lots of chips, and a system does not operate under intended specifications because of the difference. However, if the threshold voltage of a certain area of a chip is rather high but that of another area thereof is low, the operating speed of the chip differs from area to area. In the whole chip, delays occur to result in a clock skew. Consequently, there arises a drawback that a circuit does not operate normally.

Thus, the known method is effective when there is a difference in threshold voltage between chips or there is a difference in threshold voltage between relatively wide areas of a chip. However, the difference in threshold voltage is not limited to these examples. Such a situation that, for example, a difference in threshold voltage between adjoining transistors cannot be ignored will presumably arise more frequently in the future. This is because the situation is, as mentioned above, unavoidable in the process of manufacturing.

A circuit that may be greatly affected by a difference in threshold voltage between adjoining transistors is a flip-flop type sense amplifier. Several types of sense amplifiers for DRAMs have been proposed as a means for nullifying the adverse effect.

For example, one type of sense amplifier is provided with a facility for compensating for the threshold voltages of transistors constituting a flip-flop during a sensing operation. However, this type of sense amplifier must carry out an additional operation such as threshold voltage compensation in addition to the sensing operation, and is therefore unsuitable for high-speed operations that have been demanded more often in recent years.

Another type of sense amplifier is such that the source and drain of a transistor are changed between a sensing operation and threshold voltage compensation (connections are changed). However, if the threshold voltage of the transistor has a difference dependent on a direction, this type of sense amplifier cannot compensate for the difference successfully.

A pre-charge method has widely been adopted as a method for reading cell data from a DRAM. In some known approaches, a supply voltage Vcc has been used for pre-charge. However, since a sense amplifier has peripheral circuits thereof formed with CMOSs nowadays, a Vcc/2 pre-charge approach has become mainstream. For this reason, sense amplifiers adopting the Vcc pre-charge approach can preferably cope with the Vcc/2 pre-charge reading.

SUMMARY OF THE INVENTION

A major object of the present invention is to provide a threshold value compensation circuit capable of compensating for a difference of a threshold voltage from another deriving from the fine structure of transistors as well as a difference in threshold voltage between adjoining transistors.

Another object of the present invention is to provide a sense amplifier in which the threshold value compensation circuit is included for obviating the necessity of compensating for a threshold voltage during a sensing operation and for eventually making the sense amplifier adaptable to high-speed operations.

Yet another object of the present invention is to provide a sense amplifier in which the threshold value compensation circuit is included for obviating the necessity of changing the source and drain of a transistor between a sensing operation and threshold voltage compensation and for eventually realizing successful compensation of a threshold voltage.

Still another object of the present invention is to provide a sensor amplifier compatible with a Vcc/2 pre-charge approach.

To attain the above objects, according to a first aspect of the present invention, there is provided a threshold value compensation circuit for a transistor, comprising: an input terminal; a capacitor connected between the input terminal and a gate of a transistor, and having a capacitance that is larger than a conductance of the gate of said transistor; a current source connected to one terminal of the transistor; a current inflow terminal through which a current supplied from the current source passes via the transistor; a reference terminal to which a first reference voltage is applied when the threshold voltage of the transistor is compensated; a first switching device connected between the one terminal of the transistor and the gate thereof; and a second switching device connected between the reference terminal and input terminal, wherein the first switching device is turned ON so that the transistor is diode-connected, and the second switching device is turned ON so that said first reference voltage is applied to the input terminal; and after a second reference voltage is applied to the current inflow terminal, when charge dependent on the threshold voltage of the transistor is accumulated in the capacitor, the first switching device is turned OFF.

Also, according to a second aspect of the present invention, there is provided a semiconductor memory device using the threshold value compensation circuit for a transistor comprising: a threshold value compensation circuit for a transistor as set forth in claim 1; a flip-flop type sense amplifier connected between a pair of complementary bit lines; and a current source for supplying a current to each of the drains of a pair of transistors that are objects of threshold voltage compensation and constitute a flip-flop of the sense amplifier, wherein the sense amplifier includes; a pair of transistors connected between the gates of the pair of transistors that are objects of threshold voltage compensation and the drains thereof, and turned ON at the time of threshold voltage compensation so that the associated transistors are diode-connected; a pair of transfer gate transistors connected between the drains of the pair of transistors that are objects of threshold voltage compensation and the pair of complementary bit lines, and turned OFF at the time of threshold voltage compensation; and a pair of capacitors where one terminal of each are connected to the gates of the pair of transistors that are objects of threshold voltage compensation and the other terminals of each are linked to bit lines opposite to bit lines to which the drains of the associated transistors, that are objects of threshold voltage compensation, are linked.

Also, according to a third aspect of the present invention, there is provided a method of compensating for a difference of a threshold voltage of at least one transistor in the semiconductor memory device comprising the steps of: pre-charging nodes in the sense amplifier so that the potentials at the nodes become equal to a first voltage; diode-connecting the pair of transistors that are objects of threshold voltage compensation by linking the gates and drains thereof; turning OFF the pair of transfer gate transistors so as to retain the pair of capacitors in a state in which the first voltage is applied to the other terminals of the capacitors; applying a second voltage to the sources of the transistors that are objects of threshold voltage compensation; turning ON the transistor forming the first current source, then turning ON the transistors constituting the second current source, and thus starting a compensating operation; turning OFF the transistors constituting the second current source when compensation is achieved to some extent, and continuing compensation with the OFF state retained; turning OFF the diode-connected transistors when compensation is achieved fully, and leaving compensated information accumulated in one terminals of the pair of capacitors; stopping applying the second voltage to the sources of the transistors that are objects of threshold voltage compensation; and turning OFF the transistor forming the first current source, turning ON the pair of transfer gate transistors, and then terminating the compensating operation.

BRIEF DESCRIPTION OF THE DRAWINGS

Other objects and features of the present invention will be described hereinafter in detail by way of preferred embodiments with reference to the accompanying drawings, in which.

DESCRIPTION OF THE PREFERRED EMBODIMENTS

Figure 1:
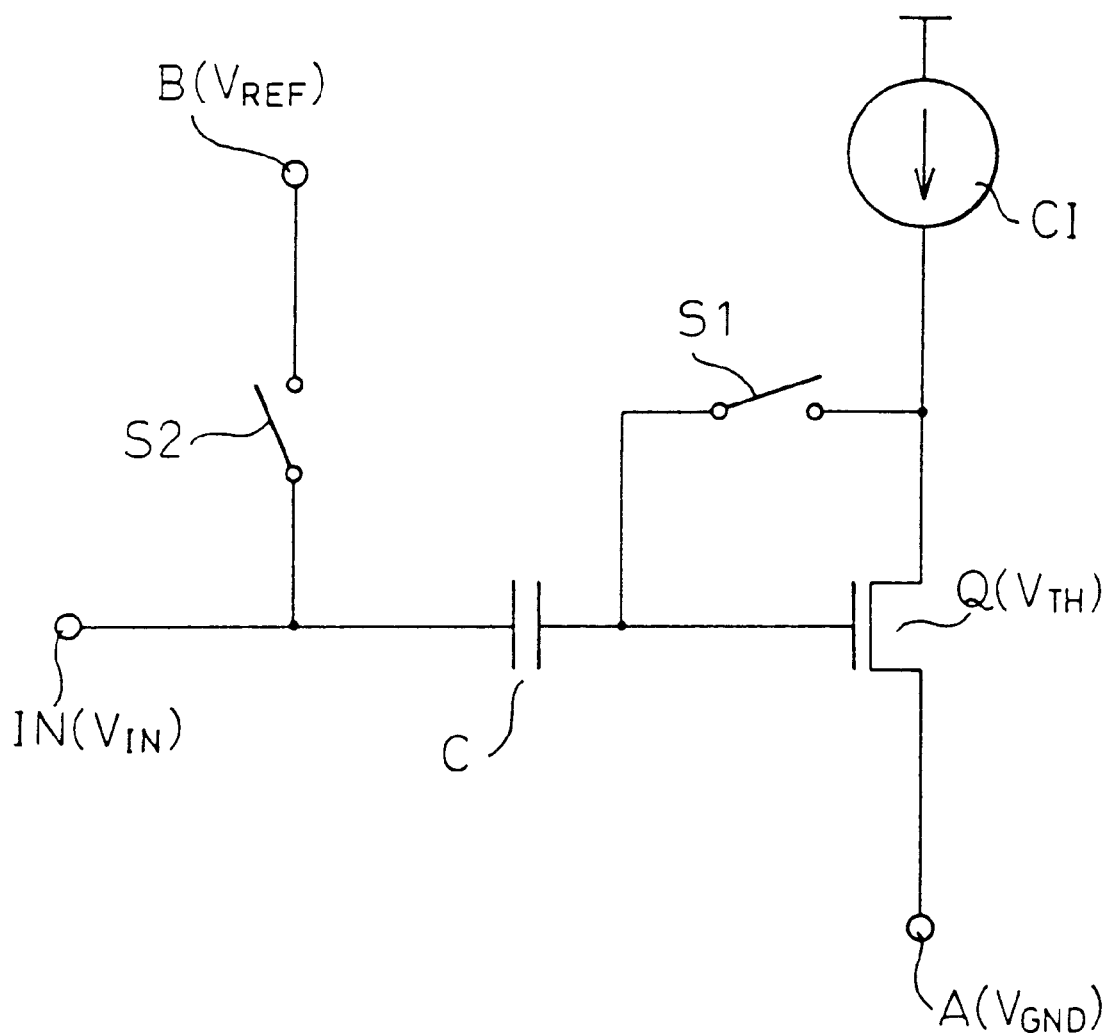
FIG. 1 is a diagram showing the principles and configuration of a threshold value compensation circuit for transistors in accordance with the present invention.

FIG. 1 shows a model of a threshold value compensation circuit for transistors in accordance with the present invention, illustrating the principles and configuration thereof.

In the drawing, there is shown a transistor Q that is an object of threshold voltage compensation. A current source CI is connected to one terminal of the transistor Q. Another terminal of the transistor Q serves as a current inflow terminal A through which a current supplied from the current source CI flows through the transistor Q. A reference voltage $V_{GND}$ is applied to the terminal A when the threshold voltage of the transistor Q is compensated. Also shown are an input terminal IN used when the transistor Q operates normally, and a reference terminal B to which a reference voltage $V_{REF}$ is applied when the threshold voltage of the transistor Q is compensated.

A capacitor C whose capacitance is sufficiently larger than the conductance of the gate of the transistor Q is connected between the gate of the transistor Q and the input terminal IN. A switching device S1 is connected between one terminal of the transistor Q and the gate thereof, and a switching device S2 is connected between the reference terminal B and input terminal IN. When the switching device S1 is turned OFF, a node between the gate of the transistor Q and the capacitor C floats. The gate of the transistor Q acts as a so-called floating gate.

In the foregoing configuration, for compensating the threshold voltage of the transistor Q, first, the switching device S1 is turned ON and the transistor Q is diode-connected. The current source CI and floating node are thus connected. Consequently, the floating gate of the transistor Q, that is, one terminal of the capacitor C is charged by a threshold voltage $V_{TH}$ with respect to the potential $V_{GND}$ of the terminal A. At this time, the reference voltage $V_{GND}$ is applied to the current inflow terminal A of the transistor Q, and the switching device S2. is turned ON. Consequently, the reference voltage $V_{REF}$ supplied through the reference terminal B is applied to the input terminal IN, that is, the other terminal of the capacitor C.

Thus, a charge dependent on the reference voltage $V_{REF}$ and the potential at the floating gate of the transistor Q (that is, charge dependent on the compensated threshold voltage $V_{Th}$ of the transistor Q) can be accumulated in the capacitor C. Thereafter, when the switching device S1 is turned OFF, the floating gate floats truly. The dependency of charge accumulated in the capacitor C on the voltages $V_{REF}$ and $V_{TH}$ is such that the compensated threshold voltage at the terminal IN becomes almost equal to a difference calculated by subtracting the voltage $V_{GND}$ from the voltage $V_{REF}$.

The threshold voltage $V_{TH}$ of the transistor Q relative to a voltage $V_{IN}$ applied to the input terminal IN (that is, gate voltage for a normal operation) can be determined arbitrarily by setting the reference voltages $V_{REF}$ and $V_{GND}$ to appropriate values. At this time, since the threshold voltage of the transistor Q is compensated when the transistor Q is diode-connected, the threshold voltage $V_{REF}$ of the transistor Q relative to the input voltage $V_{IN}$ for a normal operation can be made independent of an initial threshold voltage thereof (not compensated). In other words, the threshold voltage $V_{TH}$ of the transistor Q can be controlled to be a desired value irrespective of the initial threshold voltage.

Using the threshold value compensation circuit of the present invention, a difference of a threshold voltage from another due to the fine structure of transistors as well as a difference in threshold voltage between adjoining transistors can be compensated for.

Next, preferred embodiments of the present invention will be explained with reference to FIGS. 2 to 17.

Figure 2:
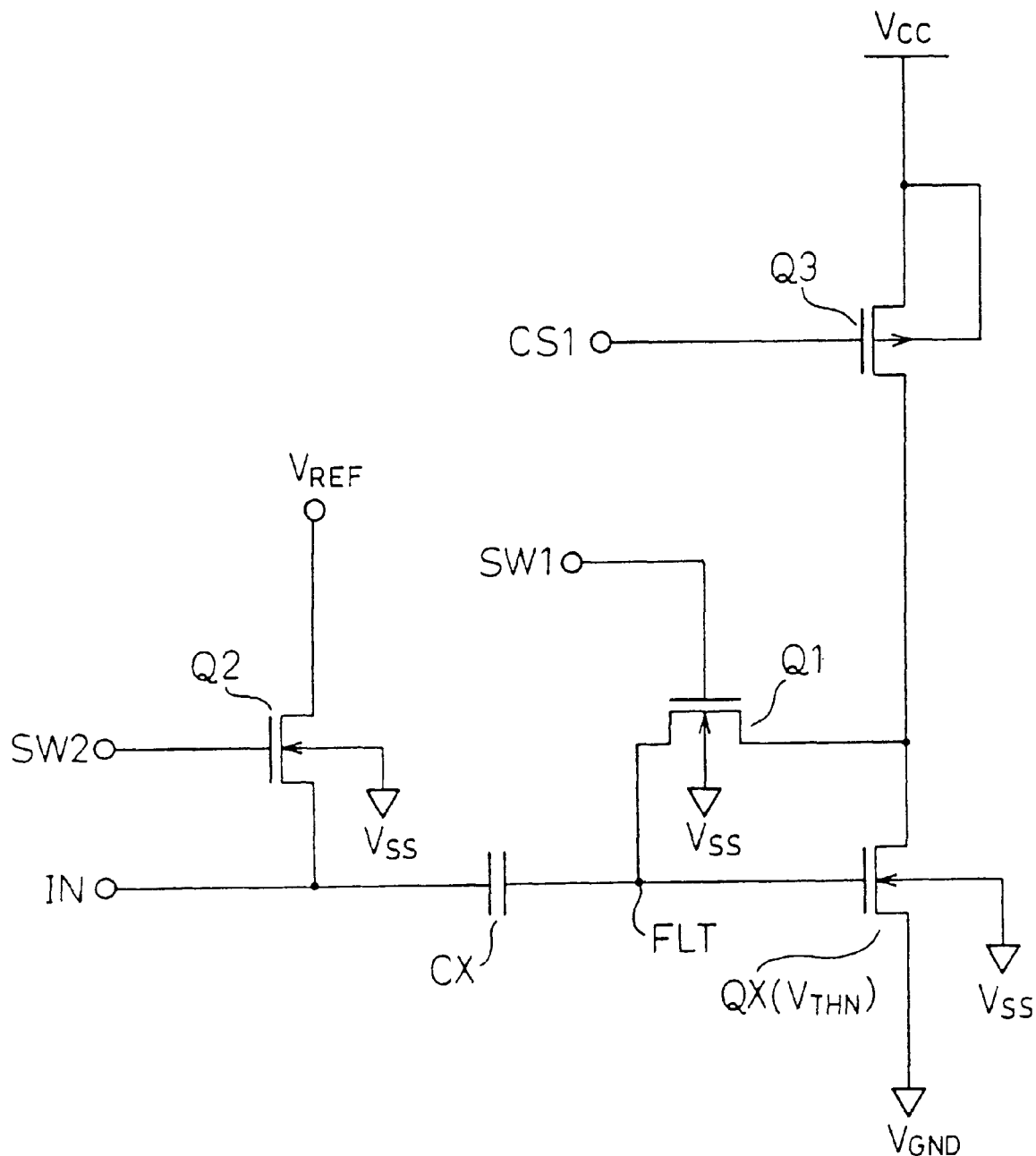
FIG. 2 is a diagram showing the configuration of a threshold value compensation circuit of the first embodiment of the present invention.

FIG. 2 shows the configuration of a threshold value compensation circuit in accordance with the first embodiment of the present invention.

In comparison with the principles and configuration illustrated in FIG. 1, the transistor Q that is an object of threshold voltage compensation corresponds to an n-channel MOS transistor QX, the capacitor C corresponds to a capacitor CX, the switching device S1 corresponds to an n-channel MOS transistor Q1, the switching device S2 corresponds to an n-channel MOS transistor Q2. and the current source CI corresponds to a p-channel MOS transistor Q3. In this embodiment, the capacitance of the capacitor CX is set to 25 fF. The ratio of the width (W) of the gate of the transistor QX to the length thereof (L), W/L, is set to 2.25/0.22 (unit: micrometer), and the ratio W/L of the transistor Q3 is set to 2.5/0.4. The capacitor CX may be fabricated through the same process as a capacitor in a cell of a normal DRAM, or fabricated in the form of a normal parallel plate capacitor. Moreover, the threshold voltage $V_{THN}$ of the transistor QX is set to 0.27 V. Incidentally, the threshold voltage $V_{THN}$ and the sizes of the transistors and capacitor in this embodiment are mere examples. The present invention is not limited to the threshold voltage and the sizes of the transistors and capacitor.

Figure 3:
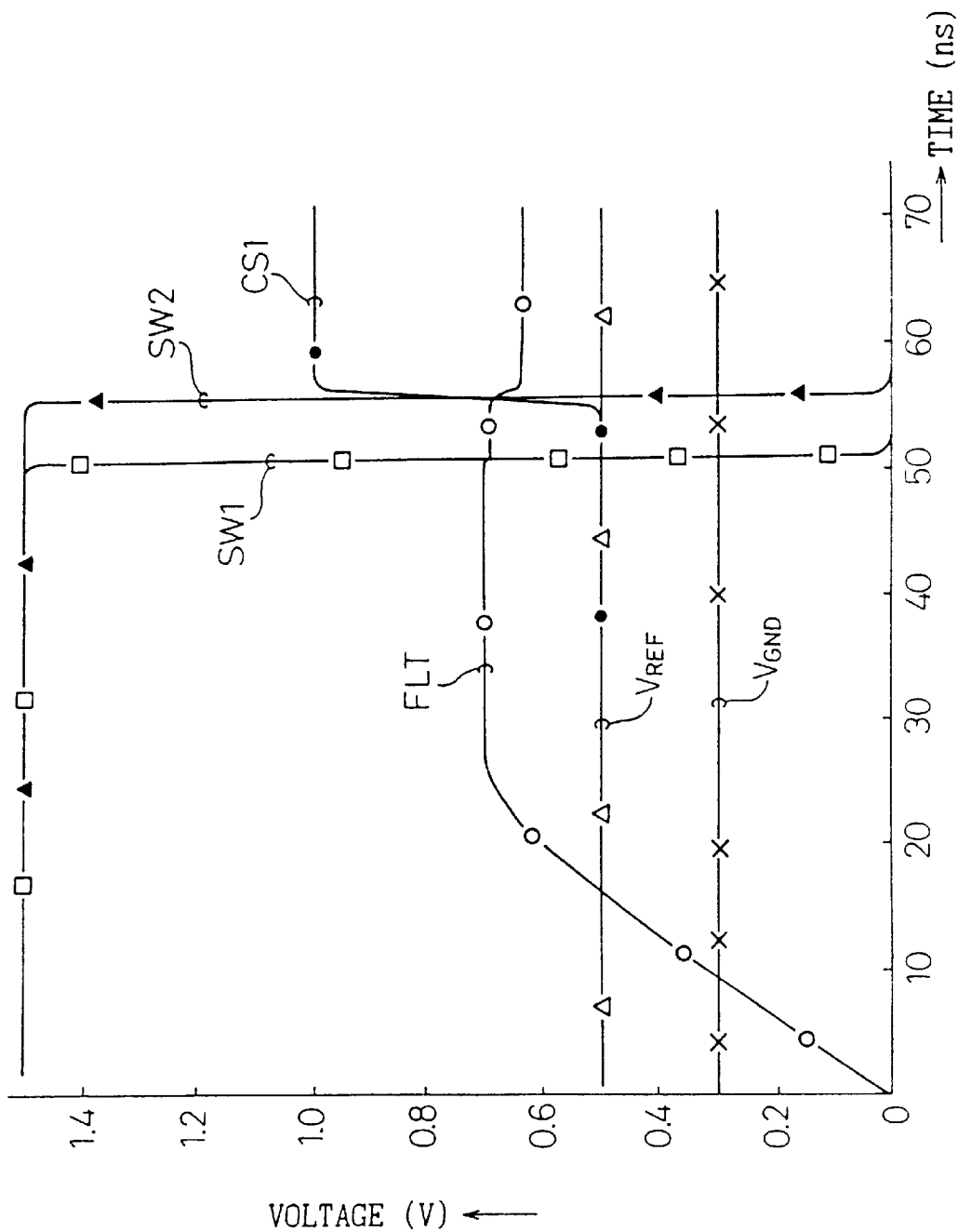
FIG. 3 is a diagram showing examples of operating waves provided by the circuit shown in FIG. 2.

Next, an operation of the circuit of this embodiment (compensation of the threshold voltage $V_{THN}$ of the transistor QX) will be described with reference to FIG. 3 showing examples of operating waves. A supply voltage Vcc shall be 1 V, and reference voltages $V_{GND}$ and $V_{REF}$ are 0.3 V and 0.5 V respectively. Other values will be presented later, but these values are also mere examples.

First, gate control signals SW1 and SW2 are driven high in order to turn ON the transistors Q1 and Q2 (in FIG. 3, the signals are already high). A control signal CS1 of 0.5 V is applied to the gate of the transistor Q3 forming a current source. The applied voltage is not limited to 0.5 V but may be any voltage as long as the voltage can bring the transistor Q3 to a state close to a saturated state.

The potential at a floating node FLT of the transistor QX having the drain and gate thereof linked when the transistor Q1 is turned ON and thus being diode-connected roses gradually with a current flowing from the current source Q3. When the potential becomes stable (about 0.7 V in the illustrated example), the control signals SW1 and SW2 are driven low and the transistors Q1 and Q2 are turned OFF. thus, charge dependent on the threshold voltage $V_{THN}$ of the transistor QX is accumulated in the floating node FLT. At this time, if the effective potential at a back gate Vss of the transistor QX is 0.5 V, the threshold voltage $V_{THN}$ becomes approximately 0.27 V (the value 0.5 V is adopted in conformity with the Vcc/2 pre-charge approach). If the potential at the back gate is set to the ground level, the threshold voltage $V_{THN}$ becomes approximately 0.14 V. The threshold voltage $V_{THN}$ can be set to a desired value, though the value may differ from one to another.

Figure 4:
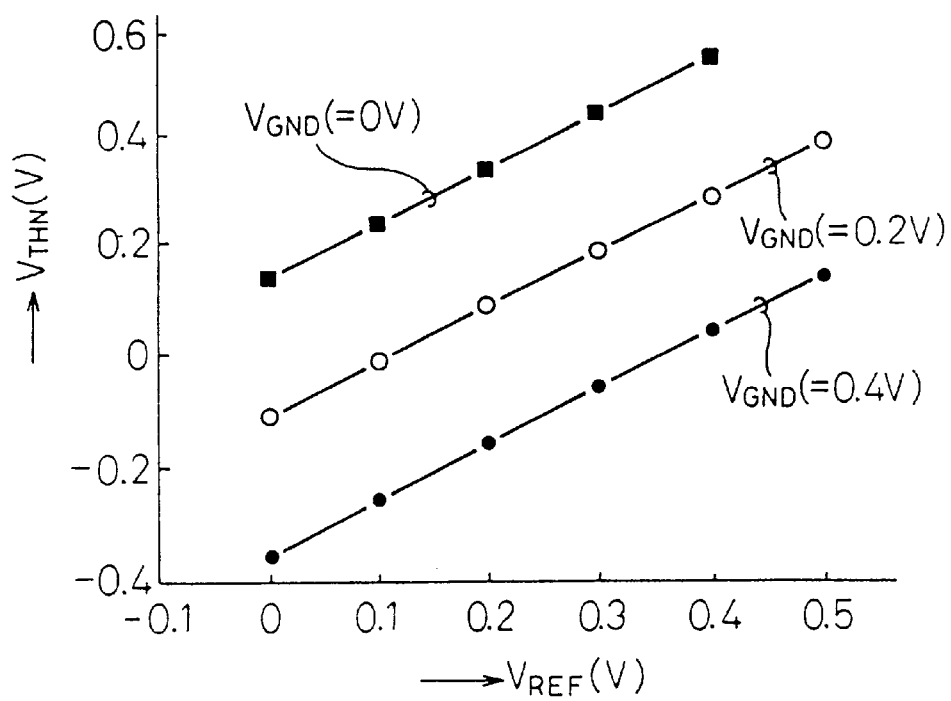
FIG. 4 is a diagram showing threshold voltage control given by the circuit shown in FIG. 2.

FIG. 4 shows threshold voltage control given by the circuit of this embodiment. Herein, the threshold voltage $V_{THN}$ is indicated with values attainable when the potential at the back gate of the transistor QX is 0.5 V. As is apparent from FIG. 4, the threshold voltage $V_{THN}$ of the transistor QX can be controlled arbitrarily depending on the reference voltages $V_{GND}$ and $V_{REF}$ to be applied for threshold voltage control. Herein, the potential at the back gate is 0.5 V. Even when the potential thereat is 0 V, the same applies.

Consequently, the threshold voltage $V_{THN}$ of the transistor QX of which value is determined by the configuration shown in FIG. 2 in the process of manufacturing can be controlled to be any desired value, The resultant threshold voltage of the transistor QX is independent of the initially determined value (initial threshold voltage). An example of the resultant threshold voltage is shown in FIG. 5.

Figure 5:
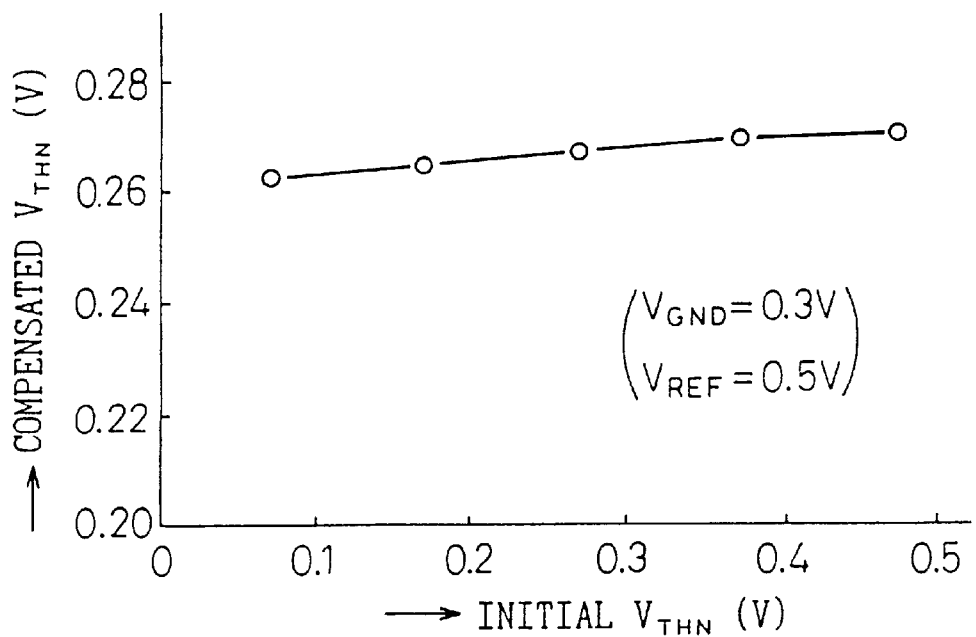
FIG. 5 is a diagram for explaining an effect exerted by the circuit shown in FIG. 2.

In FIG. 5, the axis of abscissae indicates the initial threshold voltage of the transistor QX, and the axis of ordinates indicates the controlled (compensated) threshold voltage. Herein, the reference voltages $V_{GND}$ and $V_{REF}$ are 0.3 V and 0.5 V respectively. As is apparent from FIG. 5, although the initial threshold varies, the compensated threshold voltage is substantially steady. More particularly, even if the initial threshold voltage differs by a maximum of 400 mV from another, the difference of the compensated threshold voltage from another can be confined to approximately 8.9 mV.

Thus, according to this embodiment, the difference of the threshold voltage of the transistor QX from another can be suppressed, and the threshold voltage $V_{THN}$ of the transistor QX can be controlled to be a desired value according to the values of the reference voltages $V_{GND}$ and $V_{REF}$.

In this embodiment, the threshold voltage of the n-channel MOS transistor QX is compensated. If the conductivity types of the transistor QX that is an object of threshold voltage compensation and of the transistor Q3 serving as a current source are made mutually opposite, the threshold voltage of a p-channel MOS transistor can be compensated.

Figure 6:
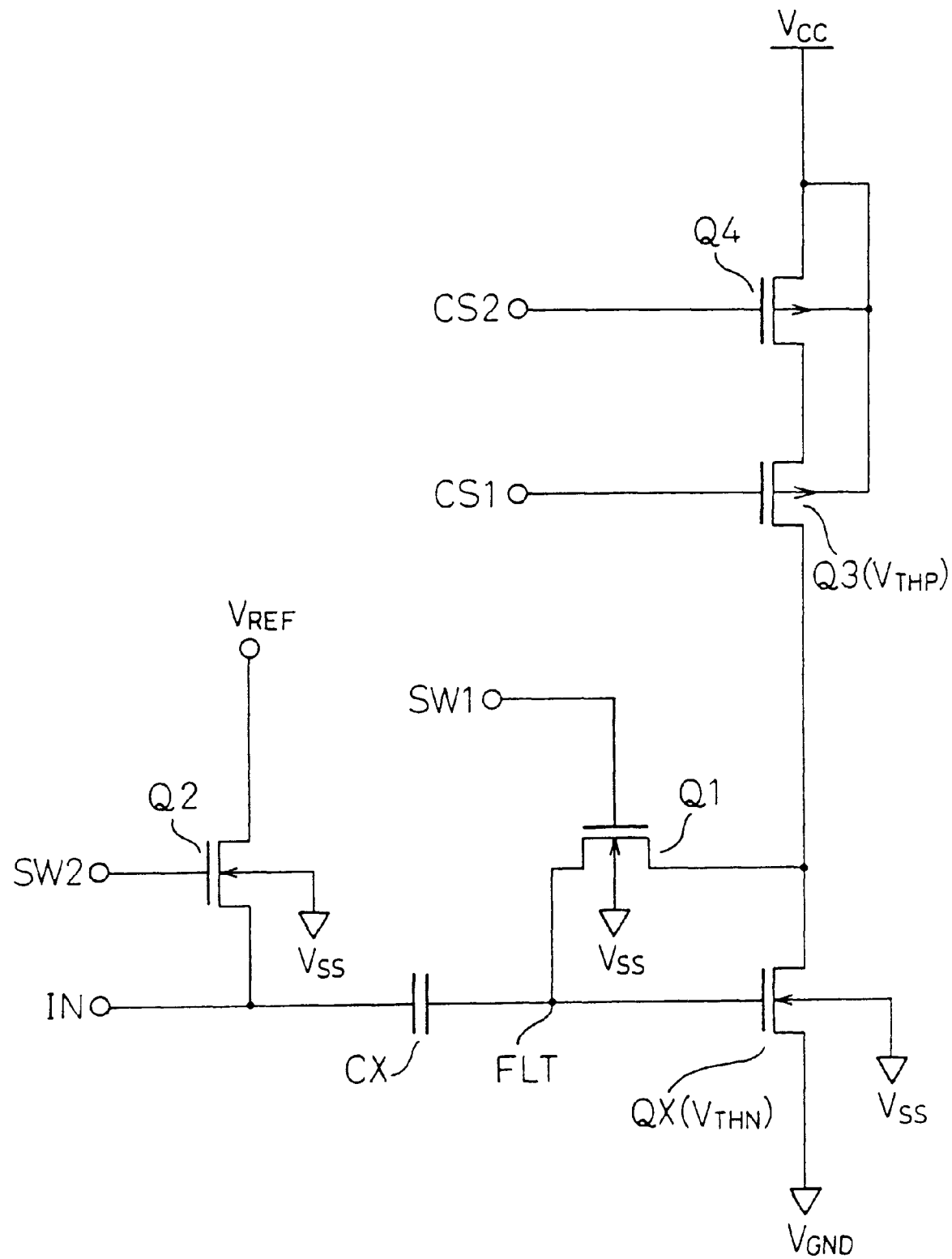
FIG. 6 is a diagram showing the configuration of a threshold value compensation circuit of the second embodiment of the present invention.

FIG. 6 shows the configuration of a threshold value compensation circuit in the second embodiment.

In the first embodiment (See FIG. 2), if the threshold voltage of the p-channel MOS transistor Q3 forming a current source is different from another, the threshold voltage of the transistor that is an object of threshold voltage compensation may become different from another.

The second embodiment attempts to resolve the foregoing drawback. For this purpose, a p-channel MOS transistor Q4 serving as another current source is connected in series with the p-channel MOS transistor Q3 on the opposite side of the p-channel MOS transistor Q3 relative to the transistor QX that is an object of threshold voltage compensation. The other circuit elements are identical to those of the first embodiment (See FIG. 2).

In this embodiment, a time lag is set to be present between an OFF operation of the transistor Q3 with the control signal CS1 and an OFF operation of the transistor Q4 with the control signal CS2. Even if the threshold voltage $V_{THF}$ of the p-channel MOS transistor Q3 differs from another, the difference of the threshold voltage $V_{THN}$ of the transistor QX from another can be suppressed and controlled to be a desired value.

Figure 7:
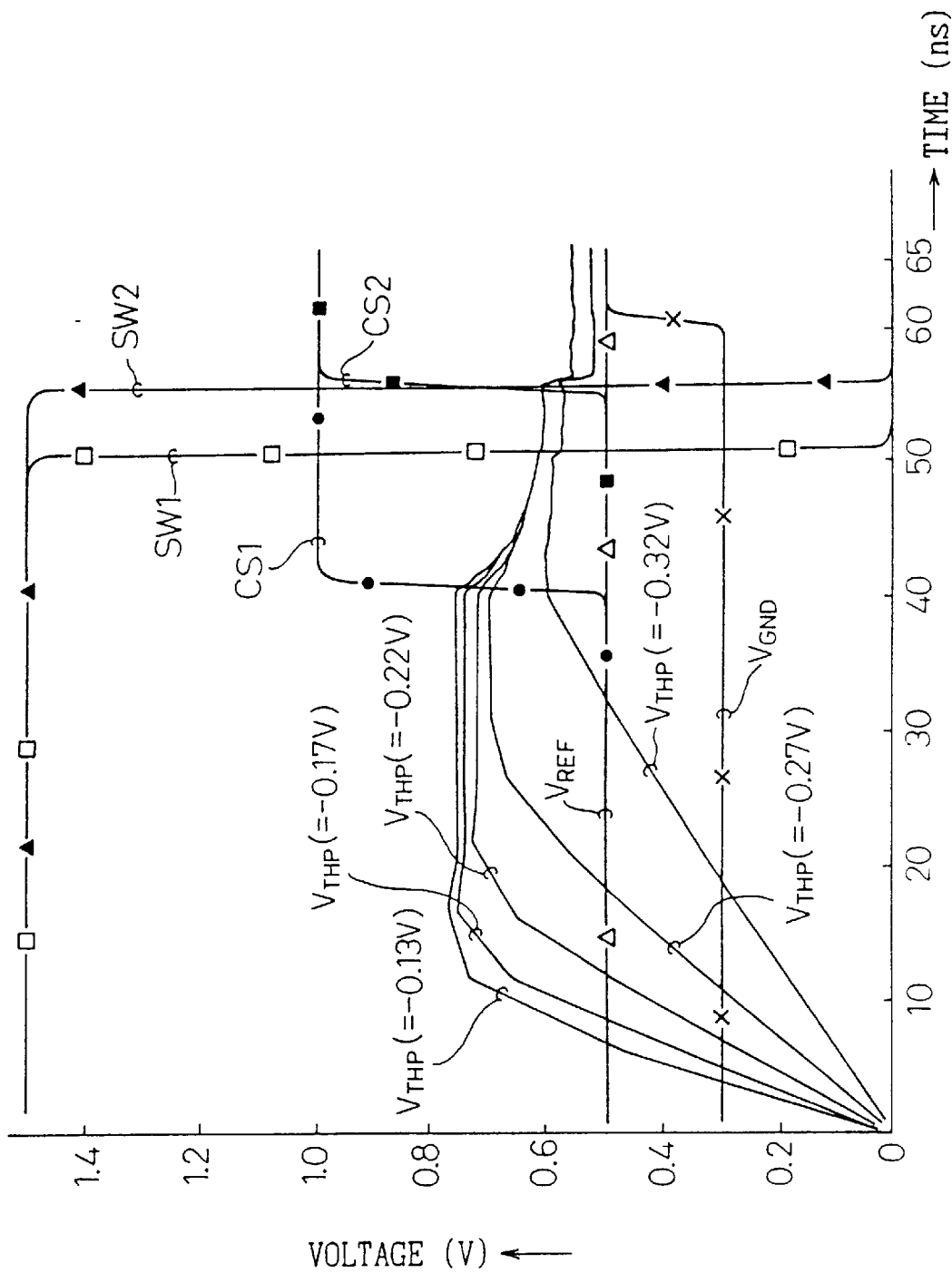
FIG. 7 is a diagram showing examples of operating waves provided by the circuit shown in FIG. 6.

FIG. 7 shows examples of operating pulses. In the example of FIG. 7, for a clear understanding of the major portion of the operating characteristics of the circuit of this embodiment, a compensating operation is carried out on the assumption that the threshold voltage $V_{THN}$ of the transistor QX remains equal, and the threshold voltage $V_{THP}$ of the transistor Q3 is different from another.

As shown in FIG. 7, after the control signal CS1 is driven high in order to turn OFF the transistor Q3. the control signal CS2 is held low for some time so that the transistor Q4 can remain ON. Consequently, as apparent from FIG. 7, the potential at the floating gate of the transistor QX becomes a pseudo steady value irrespective of the threshold voltage $V_{THP}$ of the transistor Q3. Thereafter, if the control signal SW1 is driven low in order to turn OFF the transistor Q1, a charge resulting from threshold voltage compensation is accumulated in the floating gate independently of the threshold voltage $V_{THP}$ of the transistor Q3.

The other operations and resultant effect are identical to those of the first embodiment (See FIG. 2).

Figure 8:
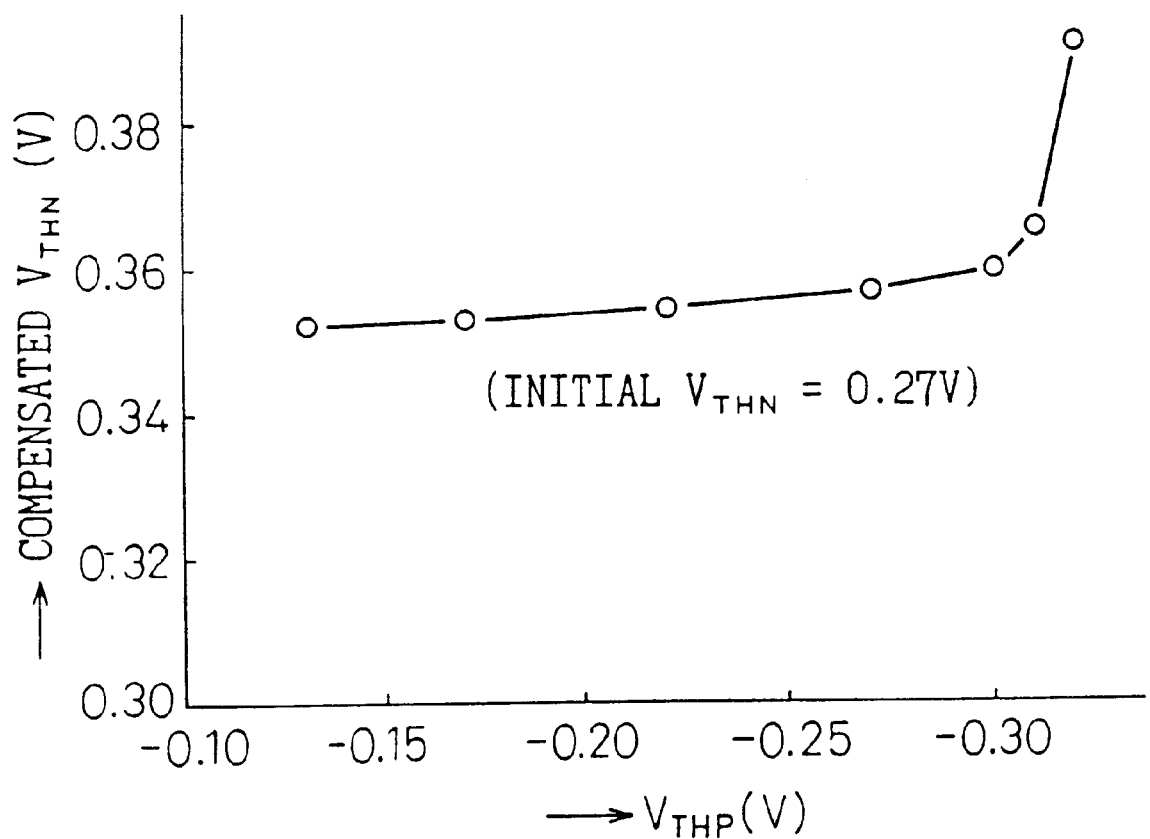
FIG. 8 is a diagram for explaining an effect exerted by the circuit shown in FIG. 6.

FIG. 8 shows the relationship between the compensated threshold voltage $V_{THN}$ of the transistor QX and the threshold voltage $V_{THP}$ of the transistor Q3 in the circuit of this embodiment. As is apparent from FIG. 8, the threshold voltage $V_{THN}$ of the transistor QX can be controlled to be steady despite the variation of the threshold voltage $V_{THP}$ up to nearly −0.30 V.

As mentioned above, according to this embodiment, even if the threshold voltage of a p-channel MOS transistor forming a current source differs from another, the difference of the threshold voltage $V_{THN}$ of the transistor QX that is an object of threshold voltage compensation therefrom can be suppressed and controlled to be a desired value.

Similarly to the first embodiment (See FIG. 2), even in this embodiment, if the conductivity types of the transistor QX that is an object of threshold voltage compensation and the transistors Q3 and Q4 serving as current sources are made mutually opposite, a circuit for compensating for the threshold voltage of a p-channel MOS transistor can be configured.

Figure 9:
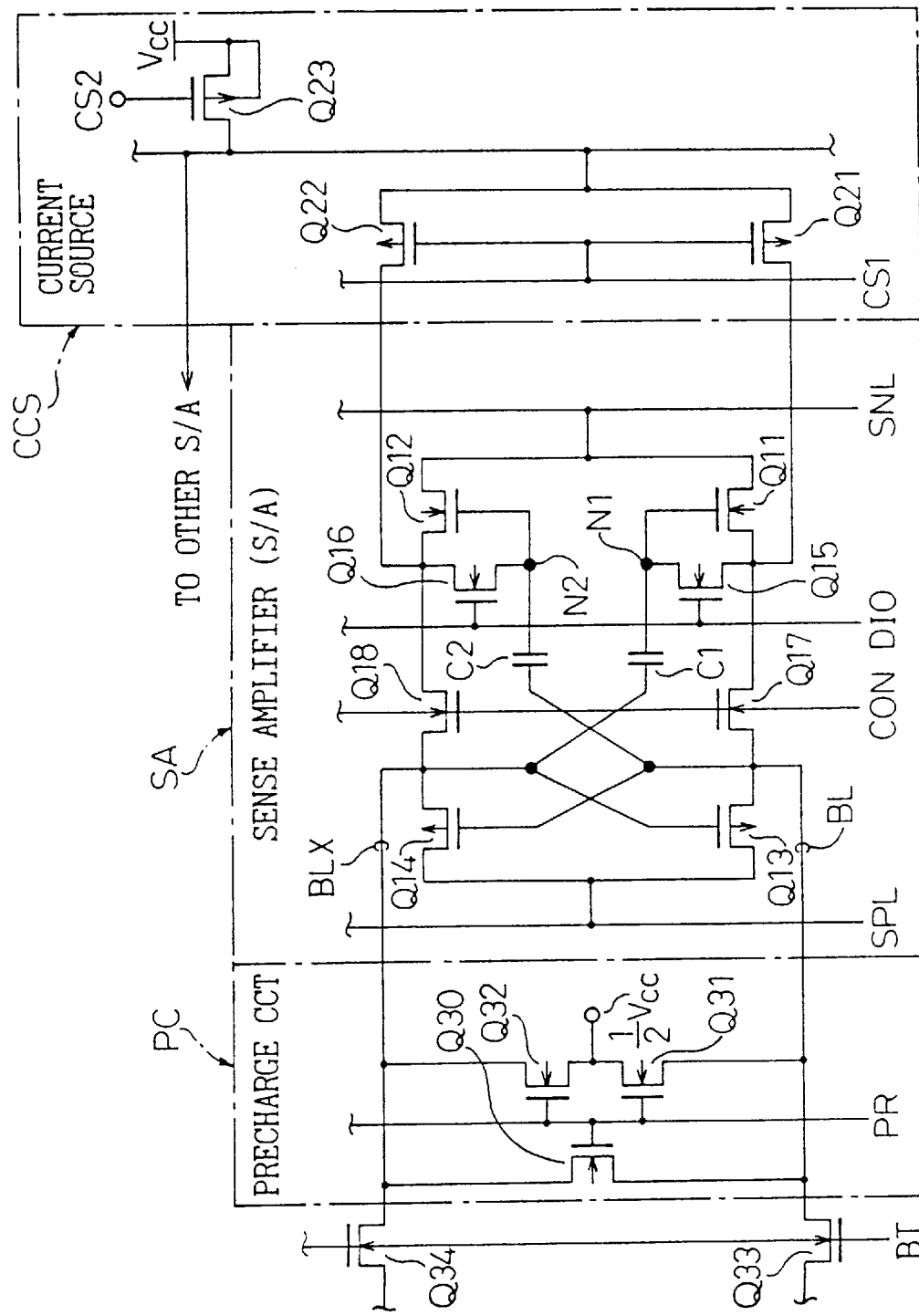
FIG. 9 is a diagram showing the configuration of a sense amplifier using a threshold value compensation circuit in accordance with the third embodiment of the present invention.

FIG. 9 shows the configuration of a sense amplifier using a threshold value compensation circuit in accordance with the third embodiment of the present invention.

In the drawing, there is shown a sense amplifier (S/A) SA in which two n-channel MOS transistors Q11 and Q12 and two p-channel MOS transistors Q13 and Q14 are as basic components are interconnected to construct flip-flops. N-channel MOS transistors Q15 and Q16 are connected between the gates of the transistors Q11 and Q12 and the drains thereof. The transistors Q15 and Q16 are turned ON for threshold voltage compensation, whereby the associated transistors Q11 and Q12 are diode-connected. Moreover, n-channel MOS transistors Q17 and Q18 are connected between the drains of the transistors Q11 and Q12 and a pair of complementary bit lines BL and BLX. These transistors Q17 and Q18 are turned OFF for threshold voltage compensation. Furthermore, capacitors C1 and C2 are connected between the gates of the transistors Q11 and Q12 and the complementary bit lines BLX and BL.

There is shown a current source CCS for supplying a current to the drains of the n-channel MOS transistors Q11 and Q12 constituting a flip-flop of the sense amplifier SA. The current source CCS includes a p-channel MOS transistor Q23 serving as a current source to be shared with other sense amplifiers (S/A), and a pair of p-channel MOS transistors Q21 and Q22 (current sources) connected between the drain of the transistor Q23 and the drains of the n-channel MOS transistors Q11 and Q12.

Also shown is a circuit PC for pre-charging the bit lines BL and BLX prior to activation of the sense amplifier SA so that the potentials at the bit lines becomes equal to a half of a supply voltage Vcc. The pre-charge circuit PC includes an n-channel MOS transistor Q30 connected between the bit lines BL and BLX, and two n-channel MOS transistors Q31 and Q32 connected in series between the bit lines BL and BLX. A node between the transistors Q31 and Q32 is linked to a Vcc/2 power line. Q33 and Q34 denote n-channel MOS transistors needed to link the bit lines BL and BLX of the sense amplifier to corresponding bit lines of a cell array (not shown).

Figure 10A:
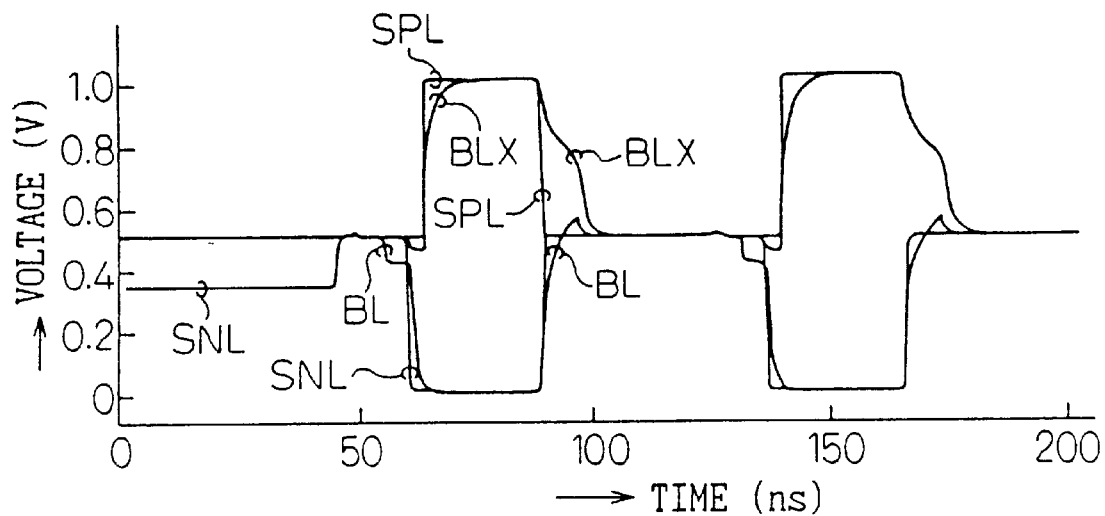
FIGS. 10a and 10b are diagrams showing examples of operating waves provided by the sense amplifier shown in FIG. 9.
Figure 10B:
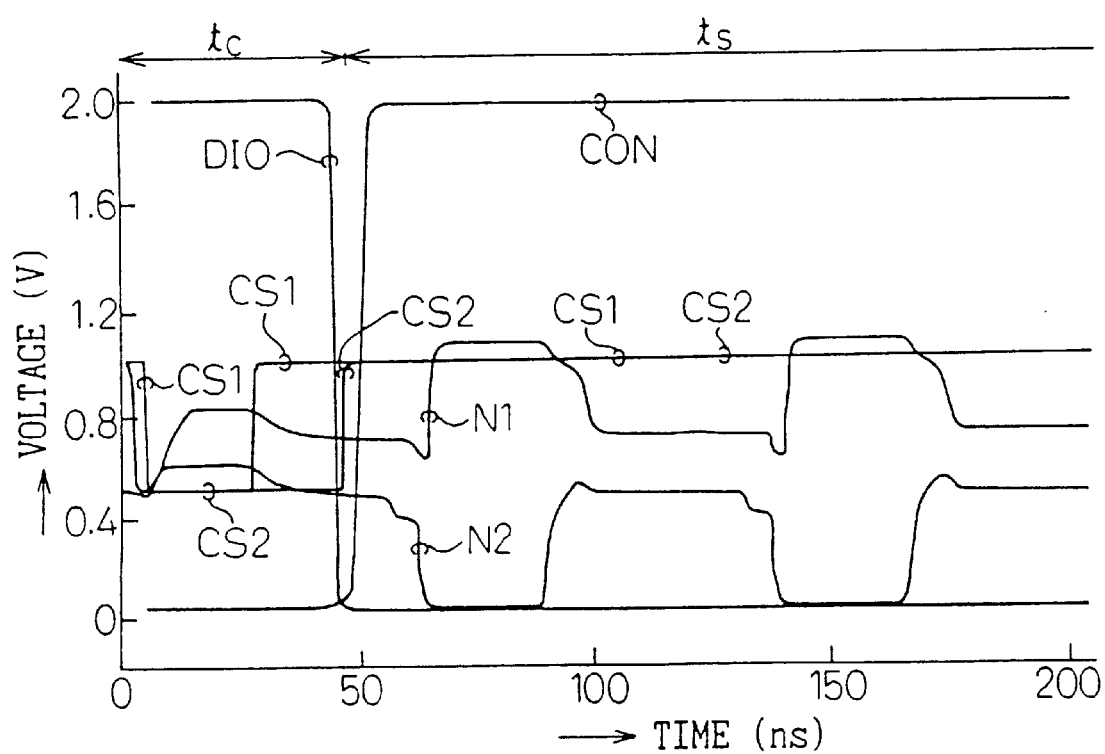

FIGS. 10a and 10b show examples of operating pulses provided by the sense amplifier in this embodiment. The fundamental operations are identical to those in the first and second embodiments. An operation specific to this embodiment will be described. Two operating pulse diagrams (see FIGS. 10a and 10b) are presented with different scales because the voltage levels of signals provided by components of the circuits are mutually different tc denotes a threshold voltage compensation period, and ts denotes a sending operation period.

First, a pre-charge signal PR is driven high, and control signals SNL and SPL are set to a voltage Vcc/2 that is a half of the supply voltage Vcc. The sense amplifier SA (including nodes N1 and N2) is pre-charged to have the voltage Vcc/2. A control signal DIO is driven high, and the transistors Q15 and Q16 are turned ON, whereby the transistors Q11 and Q12 that are objects of threshold voltage compensation are diode-connected.

A control signal CON is then driven low, and the transistors Q17 and Q18 are turned OFF, whereby the circuit elements uninvolved in threshold voltage compensation (that is, the p-channel MOS transistors Q13 and Q14 constituting a flip-flop) are isolated. At this time, nodes connected to the other terminals of the capacitors C1 and C2. that is, nodes linked to the bit lines BLX and BL are retained at the potential Vcc/2. The potential Vcc/2 corresponds to the reference voltage $V_{REF}$ shown in FIG. 1.

The control signal SNL is set to an intermediate voltage between the voltages Vcc/2 and Vss (in the illustrated example, approximately 0.33 V). The voltage corresponds to the reference voltage $V_{GND}$ shown in FIG. 1.

The voltage Vcc/2 (=0.5 V) is applied as a control signal CS2. whereby the transistor Q23 is turned ON. The voltage Vcc/2 is not limited to 0.5 V but may have any value as long as the voltage Vcc/2 can bring the transistor Q23 to a state close to a saturated state. The voltage Vcc/2 is applied as a control signal CS1. whereby the transistors Q21 and Q22 are turned ON. Likewise, the voltage Vcc/2 may have any value as long as the voltage Vcc/2 can bring the transistors Q21 and Q22 to a state close to the saturated state.

Threshold voltage compensation is then started. Specifically, the node N1 and N2 are charged so that the threshold voltages $V_{THN}$ of the transistors Q11 and Q12 are compensated.

When compensation is achieved to some extent, the voltage Vcc is applied as the control signal CS1. The potentials at the nodes N1 and N2 vary to enter a pseudo steady state, thus compensating for differences in threshold voltage of the transistors Q21 and Q22 from others if there are differences. This operation is identical to that described as part of the second embodiment (See FIG. 6). Consequently, the differences in threshold voltage of the p-channel MOS transistors Q21 and Q22 forming constant current sources can be suppressed.

When compensation is achieved fully, the control signal DIO is driven low and the transistors Q15 and Q16 are turned OFF. Consequently, compensated information is retained at one terminal (nodes N1 and N2) of each of the capacitors C1 and C2. As a result, the threshold voltages $V_{THN}$ of the transistors Q11 and Q12 can be set to a single value. As a result, a malfunction deriving from an unbalance of the threshold voltage of the sense amplifier SA can be prevented.

In FIG. 10b, as far as the sensing operation period ts succeeding the threshold voltage compensation period tc is concerned, a difference between the threshold voltages of the transistors Q11 and Q12 before. compensation is approximately 230 mV. It is seen that although a potential difference caused by charge coming from the cell over the bit lines BL and BLX is merely 70 mV, amplification is carried out normally by compensating for the difference of 230 mV.

As shown in FIG. 10b, since the nodes N1 and N2 float, information acquired during threshold voltage compensation is stored in the nodes. The threshold voltages need not be compensated every time a sensing operation is carried out.

However, when the sense amplifier is operated, since the threshold voltages of the n-channel BIOS transistors Q11 and Q12 alone are compensated, an sensing operation must first be performed on the n-channel MOS transistors.

Next, the advantage of the sense amplifier of this embodiment will be described with reference to FIG. 11.

Figure 11:
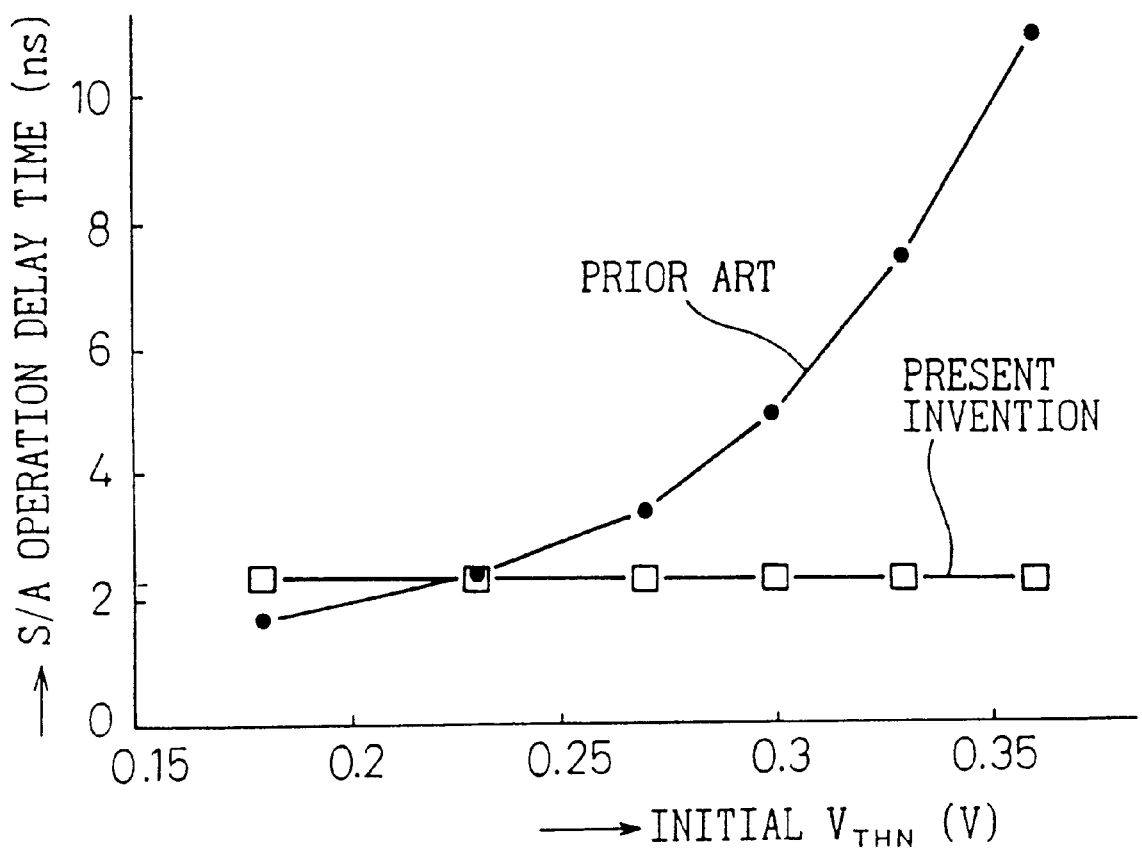
FIG. 11 is a diagram for explaining an effect exerted by the sense amplifier shown in FIG. 9.

As shown in FIG. 11, according to the compensation method, the threshold voltages of the transistors Q11 and Q12 can be set to a sole value under the same conditions for compensation. The operating speed of the sense amplifier can be held equal irrespective of an initial threshold voltage (that is, a threshold voltage is not compensated). This means that there is no difference in speed between different sense amplifiers. The operating timing can be made fully consistent among the sense amplifiers. When the sense amplifiers operate, it is unnecessary to wait for the completion of a sensing operation of a sense amplifier having the worst operating speed. Moreover, the threshold voltages of the sense amplifiers can be controlled to be a desired value. For example, even when a threshold voltage is not different from another, if the threshold voltage is set to a too high value in the process of manufacturing, the threshold voltage can be lowered according to this method. A higher-speed sensing operation can therefore be achieved.

A sense amplifier must be refreshed at intervals of a certain cycle because information (that is, charge) retained at the nodes N1 and N2 decays due to a leakage through the device.

The time is long enough to carry out a refreshing operation in a place different from a place in which refreshing a cell is in progress. Refreshing a sense amplifier can be carried out concurrently with a call refreshing operation. A problem underlying threshold voltage compensation of a sense amplifier in a prior art, that is, a time loss caused by a compensating operation, can be eliminated.

Figure 12:
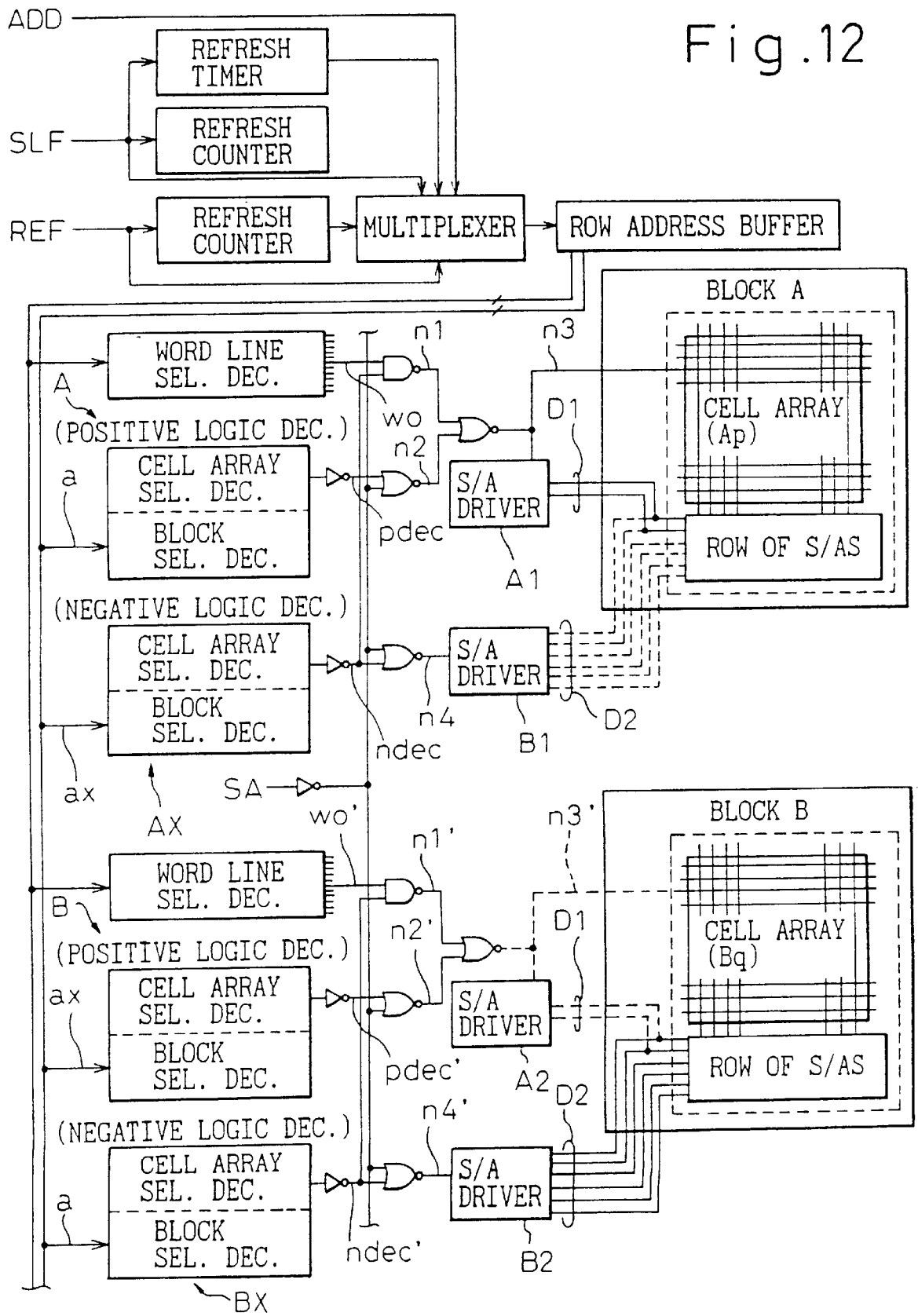
FIG. 12 is a diagram schematically showing the first example of a configuration for driving sense amplifiers to which the present invention is adapted.

FIG. 12 schematically shows the first example of a configuration for driving sense amplifiers to which the present invention is adapted.

In the illustrated example, when reading, writing or refreshing (including cell refreshing) is performed on a cell, threshold voltage compensation is carried out for a cell array other than a cell array including the cell.

In the illustrated example, a cell array on which threshold voltage compensation is performed is selected with a row address. Alternatively, a column address may be employed.

Figure 13:
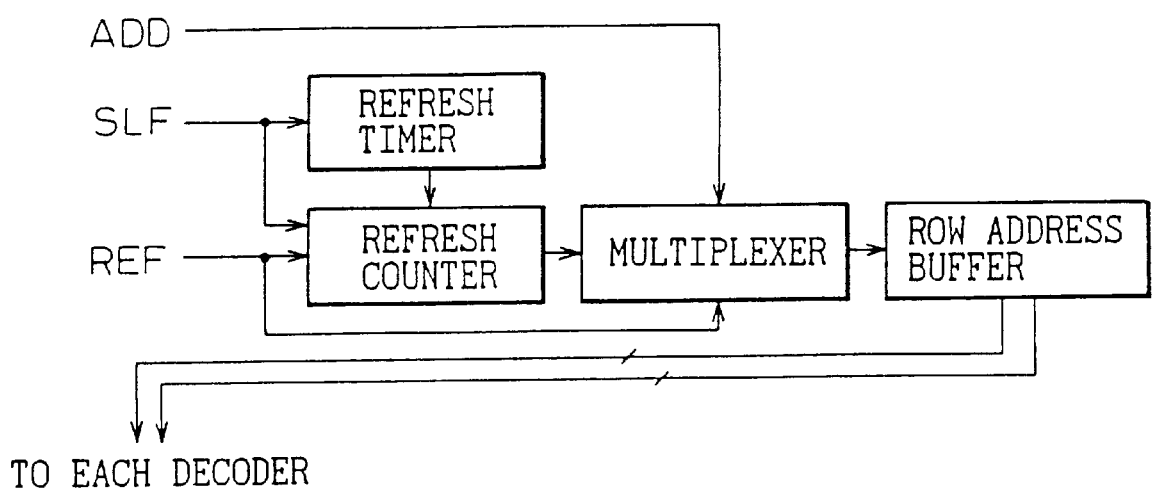
FIG. 13 is a diagram showing the configuration of a major portion of a variant of the configuration shown in FIG. 12.

In the illustrated example, a normal refresh counter responsive to a refresh signal REF and a cell refresh counter responsive to a cell refresh signal SLF are included separately. The present invention is not limited to this configuration. For example, as shown in FIG. 13, the refresh signal REF and cell refresh signal SLF may be input to one refresh counter, and thus the refresh counter may be used in common for normal refreshing and cell refreshing.

In the configuration shown in FIG. 12, when a reading or writing operation is requested relative to a memory divided into a plurality of blocks (blocks A and B in the illustrated example), an address ADD is input to a row address buffer via a multiplexer. A plurality of complementary row address signals are output so that selected cells can be accessed, and then input to selection decoders. At this time, as far as, for example, an address signal a is concerned, a positive-logic cell array/block selection decoder A that responds to the address signal a outputs a cell array selection signal pdec used to select a cell array in an associated block. Consequently, one word line in the selected cell array is selected (activated), and cell data is then read or written normally.

With the address signal a, a negative-logic cell array/block selection decoder BX is activated to output a threshold voltage compensation selection signal ndec'. Consequently, a cell array on which threshold voltage compensation is performed is selected.

If an address signal is a signal ax that is complementary to the address signal a, a cell array selected as a cell array on which reading or writing is performed with the address signal a is selected as a cell array on which threshold voltage compensation is performed. A cell array selected as a cell array on which threshold voltage compensation is performed with the address signal a is selected as a cell array on which reading or writing is performed.

For further description, assume again that an address signal is the signal a. The cell array selection signal pdec to be sent to a cell array on which reading or writing is performed is activated. The logic (NOR in the illustrated example) of the signal pdec and sense amplifier activation signal SA is calculated. A normal sense amplifier (S/A) driver A1 is then activated, and an array of sense amplifiers (S/A) operates normally. At this time, a threshold voltage compensation sense amplifier driver B1 is not activated despite input of the sense amplifier activation signal SA so that a cell array Ap remains inactive.

In a cell array selected as a cell array on which threshold voltage compensation is performed, the logic of a decode signal ndec' provided by the threshold voltage compensation cell array selection decoder BX that is a negative-logic decoder and a sense amplifier activation signal SA is calculated, and a threshold voltage compensation sense amplifier driver B2 is activated. At this time, a positive-logic decoder B connected to a cell array Bq on which threshold voltage compensation is performed is not activated. Moreover, the logic (NAND in the illustrated example) of a threshold voltage compensation selection signal ndec' and word line selection signal wo' is calculated so that the signal wo' remains inactive despite the signal ndec'. No word line in the cell array Bq is thus activated.

It is therefore possible to make a word line in a cell array, on which threshold voltage compensation is performed, unselected. In this case, the word line selection signal wo' must be output later than the threshold voltage compensation selection signal ndec'. In this example, therefore, the row address buffer is used to adjust timing so that the word line selection address signal reaches the decoders later than the block/cell array selection signal. This adjustment need not always be carried out in the row address buffer. For example, the word line selection decoders may each produce a delay or the adjustment may be made in some place between the row address buffer and work line selection decoders.

In FIG. 12, outputs D1 of the sense amplifier drivers A1 and A2 correspond to the control signals SNL and SPL in FIG. 9, and outputs D2 of the sense amplifier drivers B1 and B2 correspond to the control signals SNL, SPL, CON, DIO, CS1, and CS2 in FIG. 9. A solid line indicates that a sense amplifier driver is activated, while a dashed line indicates that a sense amplifier driver is inactivated.

Figure 14A:
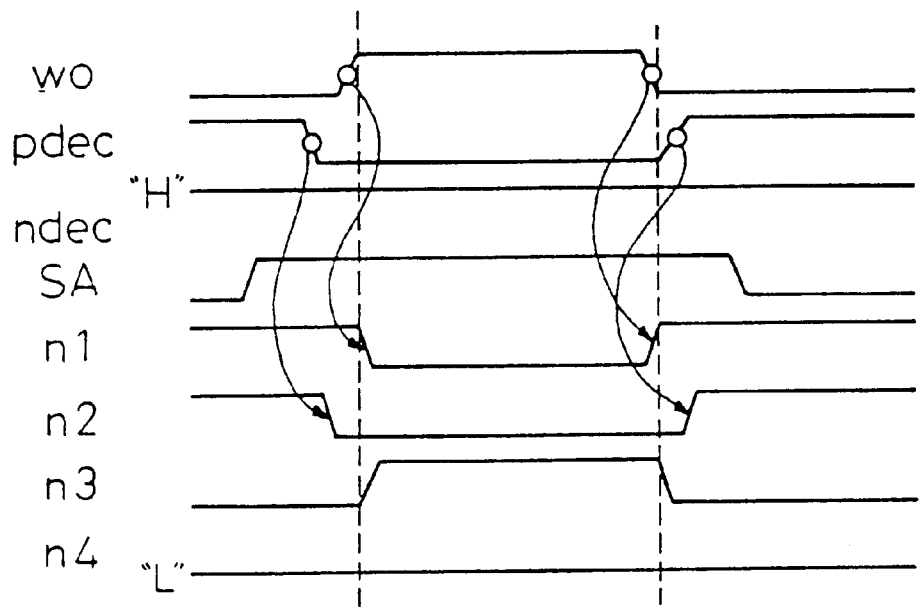
FIGS. 14a and 14b are diagrams showing examples of operating pulses used to drive the sense amplifiers configured as shown in FIG. 12.
Figure 14B:
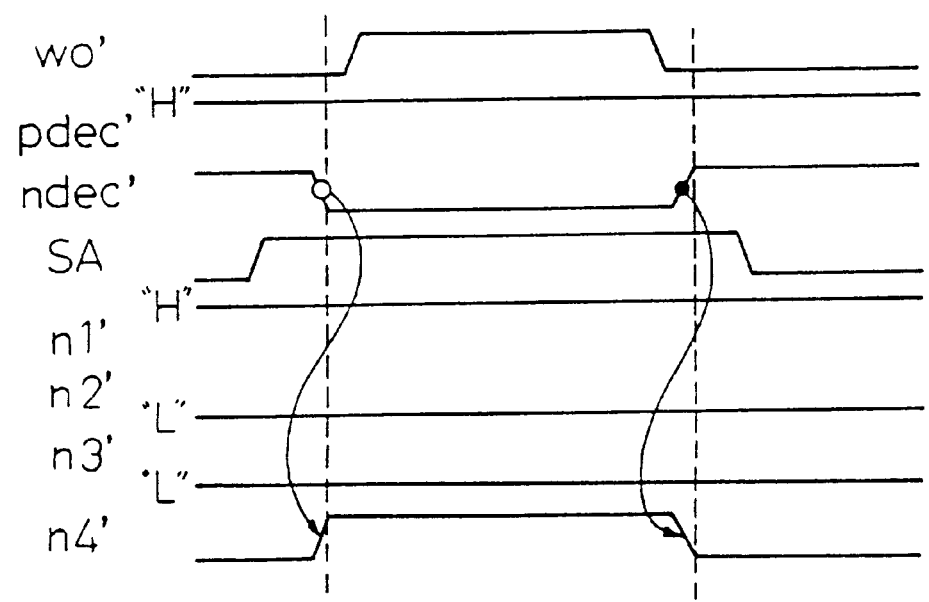

FIGS. 14a and 14b show examples of operating pulses used to drive a sense amplifier. FIG. 14a shows operating pulses used for a cell array from or in which cell data is read or written, while FIG. 14b shows operating pulses used for a cell array on which threshold voltage compensation is performed.

The above description is concerned with the relationship between selection of a cell array from or in which cell data is read or written and selection of a cell array on which threshold voltage compensation is performed. The description of the relationship between selection of a cell array on which normal refreshing is performed and selection of a cell array on which threshold voltage compensation is performed, and the relationship between selection of a cell array on which cell refreshing is performed and selection of a cell array on which threshold voltage compensation is performed will be omitted because the components succeeding the row address buffer are the same.

In normal cell data refreshing, the refresh counter operates in response to the refresh signal REF. An address produced by the refresh counter is sent to the row address buffer via the multiplexer. At this time, the multiplexer reads an address provided by the refresh counter for normal refreshing on the basis of a control signal produced from the cell refresh signal REF.

In self cell data refreshing, the refresh counter operates in response to the cell refresh signal SLF. An address provided by the refresh counter is sent to the row address buffer via the multiplexer. At this time, the multiplexer reads an address provided by the refresh counter for cell refreshing on the basis of a control signal produced from the cell refresh signal SLF.

Figure 15:
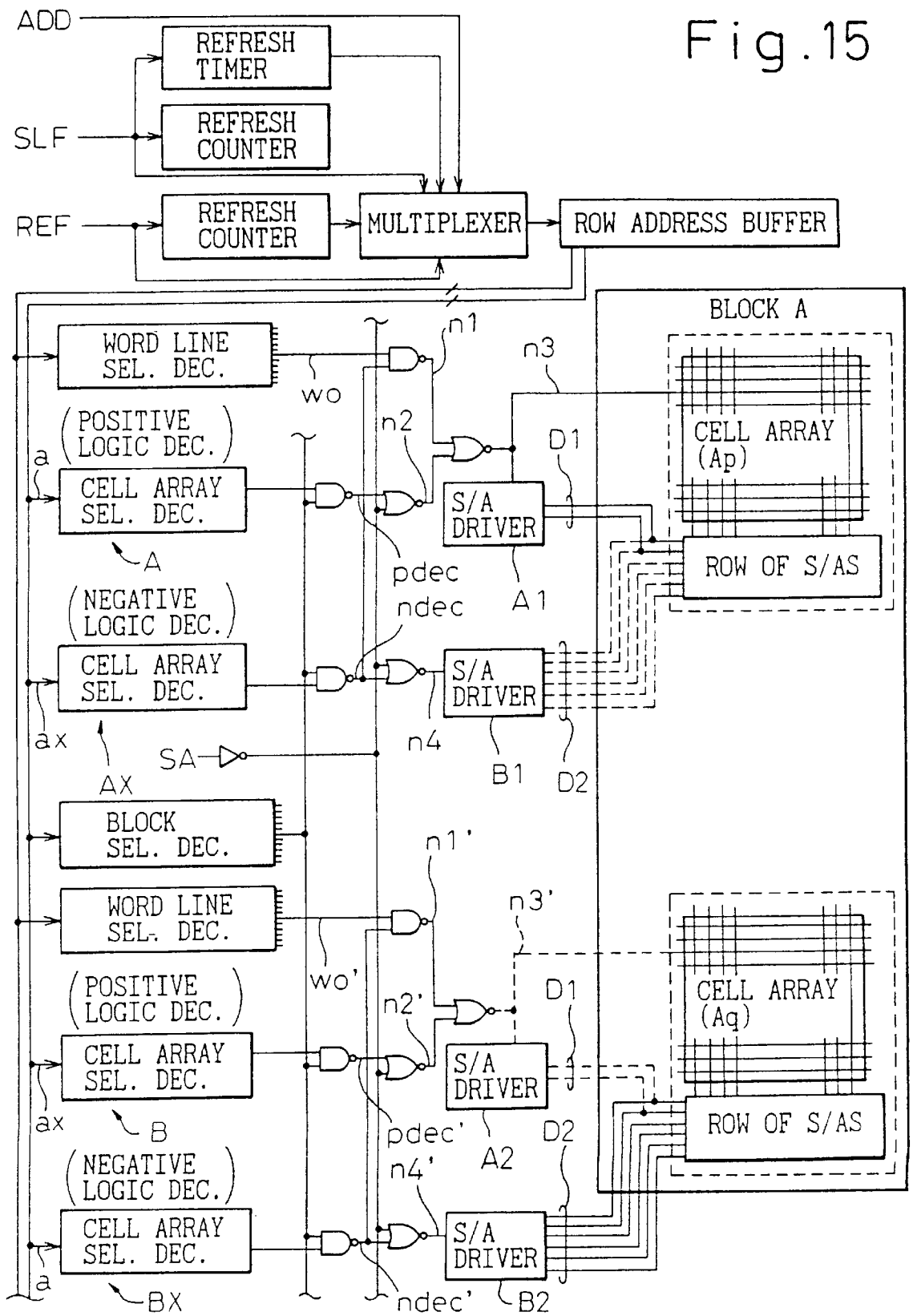
FIG. 15 is a diagram schematically showing the second example of the configuration for driving sense amplifiers to which the present invention is adapted.

In self cell data refreshing, the count provided by the refresh counter is incremented at intervals of the time indicated by the refresh timer, whereby an address is advanced. In the example of a configuration shown in FIG. 12, each pair of the cell array selection decoders and block selection decoders is illustrated as adjacent. Alternatively, each pair of the cell array selection decoders and block selection decoders may be separated from each other. In reality, the number of block selection decoders is often smaller than the number of cell array selection decoders. The block selection decoders and cell array selection decoder are not therefore often installed adjacently. FIG. 15 shows an example of such a configuration.

FIG. 15 schematically shows the second example of a configuration for driving senses amplifiers to which the present invention is adapted. In this example, any of reading or writing of cell data, cell data refreshing, and self cell data refreshing is performed on a cell array Ap in a block A. Threshold voltage compensation is performed on another cell array Aq.

Figure 16:
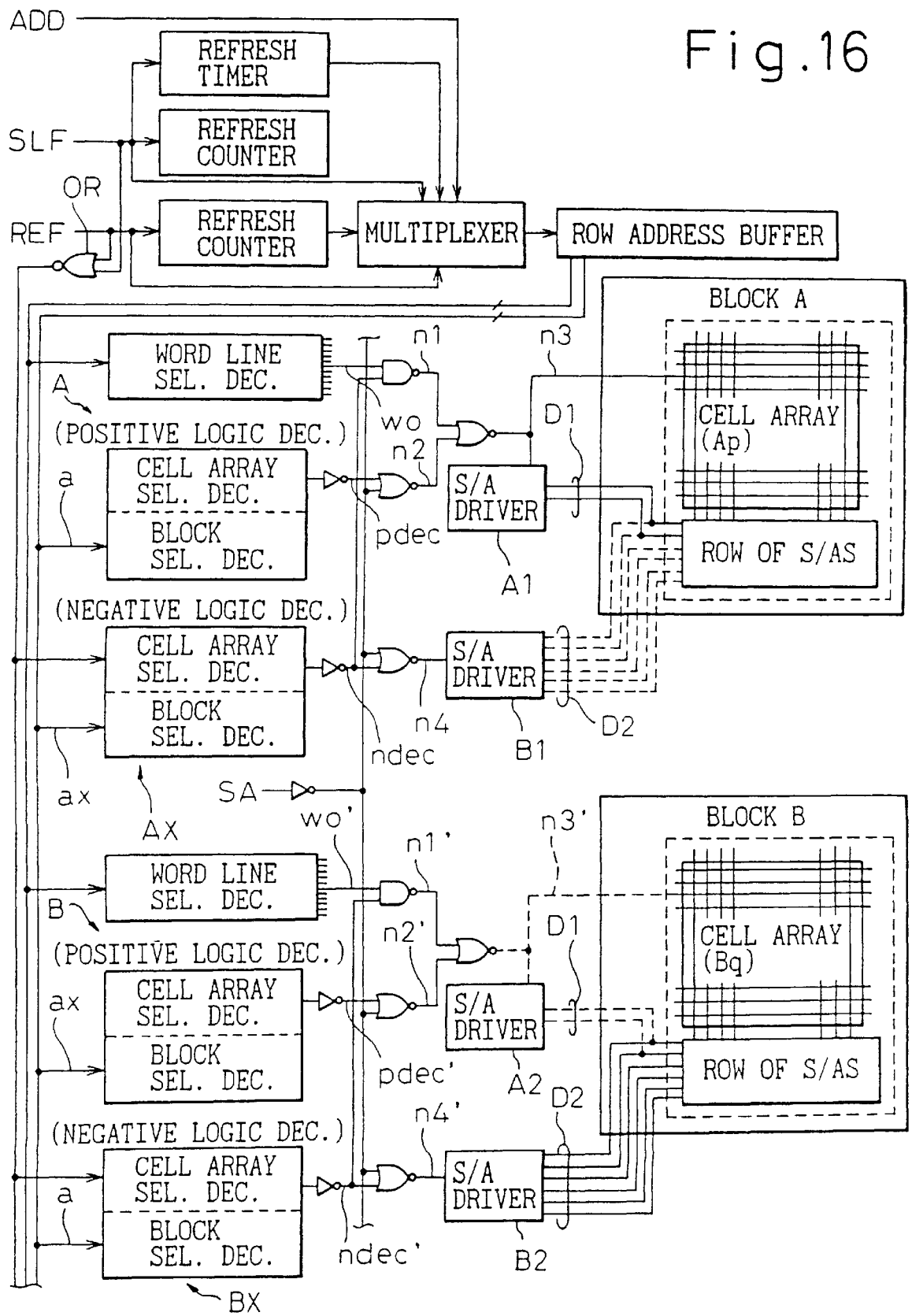
FIG. 16 is a diagram schematically showing the third example of the configuration for driving sense amplifiers to which the present invention is adapted.

FIG. 16 schematically shows the third example of a configuration for driving sense amplifiers to which the present invention is adapted, In the illustrated example, when refreshing (or cell refreshing) is carried out, threshold voltage compensation is performed on a cell array other than a cell array on which cell data refreshing (or self cell data refreshing) is performed. When reading or writing of cell data is carried out, threshold voltage compensation is not carried out.

In the example of FIG. 16, an OR gate responsive to a refresh signal REF and cell refresh signal SLF is included. Based on an output of the OR gate, negative-logic decoders AX and BX are activated at the time of refreshing or cell refreshing.

Figure 17:
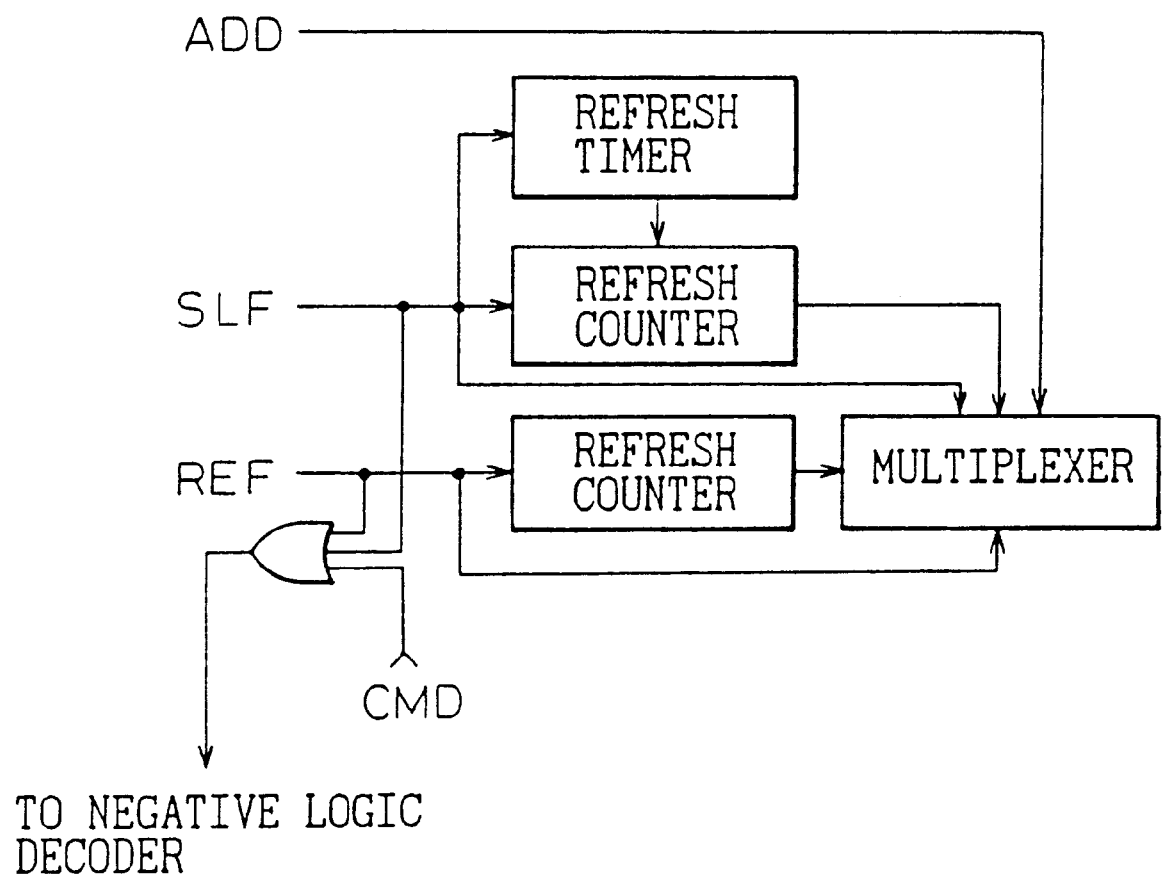
FIG. 17 is a diagram showing the configuration of a major portion of a variant of the configuration shown in FIG. 16.

As shown in FIG. 16, according to an operating method in which threshold voltage compensation is not carried out during reading or writing of cell data, as shown as a variant in FIG. 17, whether or not threshold voltage compensation is carried out can be selected by controlling the OR gate with an external command signal CMD.

What is claimed is:
1. A threshold value compensation circuit for a transistor, comprising:

an input terminal;

a capacitor connected between said input terminal and a gate of said transistor, and having a capacitance that is larger than a conductance of said gate of said transistor;

a current source connected to one terminal of said transistor;

a current inflow terminal through which a current supplied from said current source passes via said transistor;

a reference terminal to which a first reference voltage is applied when the threshold voltage of said transistor is compensated;

a first switching device connected between the one terminal of said transistor and the gate thereof; and a second switching device connected between said reference terminal and input terminal, wherein said first switching device is turned ON so that said transistor is diode-connected, and said second switching device is turned ON so that said first reference voltage is applied to said input terminal; and after a second reference voltage is applied to said current inflow terminal so that charge dependent on the threshold voltage of said transistor is accumulated in said capacitor, said first switching device is turned OFF.

2. The threshold value compensation circuit as set forth in claim 1, wherein said first and second switching devices are formed with second transistors, and said current source is formed with a third transistor whose conductivity type is opposite to that of said transistor.

3. The threshold value compensation circuit as set forth in claim 1, wherein said first and second switching devices are formed with second transistors, and said current source is formed with two third transistors which are connected in series with each other and of which conductivity types are opposite to that of said transistor; before said first switching device is turned ON and then OFF, one of said two third transistors connected in series with each other which is located closer to said transistor is turned OFF earlier than the other third transistor located away from said transistor.

4. A semiconductor memory device comprising:

a threshold value compensation circuit for a pair of first transistors;

a flip-flop type sense amplifier connected between a pair of complementary bit lines; and a current source for supplying a current to each of the drains of the pair of first transistors and constitute a flip-flop of said sense amplifier, wherein said sense amplifier includes: a pair of second transistors connected between the gates of said pair of first transistors and the drains thereof, and turned ON at the time of threshold voltage compensation so that said first transistors are diode-connected; a pair of transfer gate transistors connected between the drains of said pair of first transistors and said pair of complementary bit lines, and turned OFF at the time of threshold voltage compensation; and a pair of capacitors one terminal of each of which are connected to the gates of said pair of first transistors and the other terminals of which are linked to bit lines opposite to bit lines to which the drains of said first transistors are linked.

5. The semiconductor memory device as set forth in claim 4, wherein said current source includes a first current source shared with other sense amplifiers and formed with a third transistor, and a second current source composed of a pair of fourth transistors connected between said first current source and the drains of said pair of first transistors.

6. The semiconductor memory device as set forth in claim 5, wherein threshold voltage compensation is carried out in units of a cell array or block having a given size, and performed on a cell array other than a cell array on which reading or writing of cell data or refreshing is performed.

7. The semiconductor memory device as set forth in claim 6, further comprising:

first cell array selection decoders each activated in response to an address signal to thus select a cell array on which reading or writing of cell data or refreshing is performed;

second cell array selection decoders each activated in response to an address signal that is complementary to said address signal to thus select a cell array on which threshold voltage compensation is performed;

first sense amplifier drivers each activated when reading or writing of cell data or refreshing is performed on an associated cell array; and second sense amplifier drivers each activated when threshold voltage compensation is performed on an associated cell array, wherein when said second cell array selection decoders each select a cell array on which threshold voltage compenation is performed, threshold voltage compensation is carried out in such a way that no word line in the cell array will not be activated.

8. The semiconductor memory device as set forth in claim 7, wherein only when refreshing of cell data is carried out, threshold voltage compensation is performed on a cell array other than a cell array on which the refreshing is performed; and when reading or writing of cell data is carried out, threshold voltage compensation is not carried out.

9. The semiconductor memory device as set forth in claim 7, wherein when refreshing of cell data is carried out, threshold voltage compensation is performed on a cell array other than a cell array on which the refreshing is performed; when reading or writing of cell data is carried out, whether or not threshold voltage compensation is performed on a cell array other than a cell array on which the reading or writing of cell data is performed is selected with an external command.

10. A method of compensating for a threshold value of at least one transistor in a semiconductor memory device comprising a threshold value compensation circuit for a pair of first transistors; a flip-flop type sense amplifier connected between a pair of complementary bit lines; and a current source for supplying a current to each of the drains of the pair of first transistors and constitute a flip-flop of said sense amplifier, wherein said sense amplifier includes: a pair of second transistors connected between the gates of said pair of first transistors and the drains thereof, and turned ON at the time of threshold voltage compensation so that said first transistors are diode-connected; a pair of transfer gate transistors connected between the drains of said pair of first transistors and said pair of complementary bit lines, and turned OFF at the time of threshold voltage compensation; and a pair of capacitors one terminal of each of which are connected to the gates of said pair of first transistors and the other terminals of which are linked to bit lines opposite to bit lines to which the drains of said first transistor are linked, wherein said current source includes a first current source shared with other sense amplifiers and formed with a third transistor, and a second current source composed of a pair of fourth transistors connected between said first current source and the drains of said pair of first transistors, the method comprising the steps of:

pre-charging nodes in said sense amplifier so that the potentials at the nodes become equal to a first voltage;

diode-connecting said pair of first transistors by linking the gates and drains thereof;

turning OFF said pair of transfer gate transistors so as to retain said pair of capacitors in a state in which said first voltage is applied to the other terminals of said capacitors;

applying a second voltage to the sources of said first transistors;

turning ON said third transistor forming said first current source, then turning ON said pair of fourth transistors constituting said second current source, and thus starting a compensation operation;

turning OFF said pair of fourth transistors constituting said second current source when compensation is achieved to some extent, and continuing compensation with the OFF state retained;

turning OFF said diode-connected first transistors when compensation is achieved fully, and leaving compensated information accumulated in one terminal of each of said pair of capacitors;

stopping applying said second voltage to the sources of said first transistors; and turning OFF said third transistor forming said first current source, turning ON said pair of transfer gate transistors, and then terminating the compensating operation.

11. The method as set forth in claim 10, wherein said first voltage is set to a half of a voltage Vcc or a voltage Vcc/2 where the voltage Vcc is a high supply voltage, and said second voltage is set to a voltage Vss where the voltage Vss is an intermediate voltage between a lower supply voltage and the voltage Vcc/2.

12. The method as set forth in claim 10, wherein when a sense amplifier is to be refreshed, a sense amplifier in a place other than a place in which a cell is refreshed is refreshed concurrently with the cell refreshing operation.

* * * * *

UNITED STATES PATENT AND TRADEMARK OFFICE
CERTIFICATE OF CORRECTION

PATENT NO.   : 5,949,270

DATED        : September 7, 1999

INVENTOR(S)  : SAITO

It is certified that error appears in the above-identified patent and that said Letters Patent is hereby corrected as shown below:

On title page,

Item [30], delete "8-154572" insert therefor -- 8-154512 --

Signed and Sealed this

Twenty-first Day of March, 2000

Attest:

Q. TODD DICKINSON

Attesting Officer

Commissioner of Patents and Trademarks